United States Patent [19]

Davis

[11] 4,041,405
[45] Aug. 9, 1977

[54] SAWTOOTH WAVEFORM GENERATOR

[75] Inventor: Richard Kent Davis, Salem, Va.

[73] Assignee: General Electric Company, New York, N.Y.

[21] Appl. No.: 714,152

[22] Filed: Aug. 13, 1976

[51] Int. Cl.² ............................................. H03K 4/10
[52] U.S. Cl. .................................... 328/181; 328/28; 328/127
[58] Field of Search ............... 328/28, 127, 128, 181; 307/229

[56] References Cited

U.S. PATENT DOCUMENTS

| 2,980,866 | 4/1961 | Haines, Jr. | 328/181 |
| 3,386,039 | 5/1968 | Naive | 328/181 |

Primary Examiner—Stanley D. Miller, Jr.
Assistant Examiner—B. P. Davis
Attorney, Agent, or Firm—Walter C. Bernkopf; Robert A. Cahill

[57] ABSTRACT

A generator for generating sawtooth waveforms having equal excursion of predetermined amplitude about a reference level, synchronized in frequency with the zero crossings of an AC signal. The AC signal is applied to a zero crossing detector whose resulting pulse output is connected to the input of a first integrating amplifier. The latter integrates in a first direction to produce at its output a rapid potential excursion in a first direction to a predetermined amplitude established by a Zener clamping circuit connected across the first integrator. Upon termination of each zero crossing pulse, a source of DC connected through a resistor to the input of the first integrator, produces integration in a second direction and a gradual change of integrator output in a second polarity direction until the occurrence of the next zero crossing pulse. The sawtooth output is connected to the input of a second integrating amplifier. The latter has a long RC time constant in respect to the frequency of the zero crossing detector pulses and provides an error signal output which after appropriate inversion is supplied to the input of the first integrating amplifier to provide the equal bi-polar excursions of the sawtooth waveform.

5 Claims, 9 Drawing Figures

SAWTOOTH WAVEFORM GENERATOR

BACKGROUND OF THE INVENTION

This invention relates to generation of sawtooth waveforms, and in particular, to a sawtooth waveform generator adapted to provide a train of sawtooth waveform signals, having equal bipolar excursions of predetermined amplitude and of a frequency having a predetermined relationship with the frequency of an external AC input signal.

Sawtooth waveforms are commonly utilized for modulation and other applications requiring that the sawtooth have precisely defined characteristics, such as equal bipolar excursions of a predetermined magnitude and a time duration having a predetermined relationship with another signal, such as for example, an alternating current signal. For example, sawtooth waveforms are utilized to convert variable amplitude signals into pulse width modulated signals in connection with AC power conversion.

In electric power conversion systems an AC input signal is commonly coupled through a static switching arrangement, such as back to back connected silicon controlled rectifiers. Firing pulses are supplied to the switching arrangement to control its conduction period during each cycle of the AC input signal. The conduction period is a function of an analog control signal, such as the amplitude of a DC signal. Control systems for this purpose commonly modulate the analog signal with a train of sawtooth waveforms to provide pulse width modulated pulses, i.e. a train of pulses having a time duration representative of the desired conduction period of the switching arrangement. The sawtooth waveforms utilized in certain control applications must have equal bipolar excursions of predetermined amplitude and a time duration, i.e. frequency, which is related in a predetermined manner with the frequency of the AC input signal. Commonly, the frequency of the sawtooth waveform is twice the frequency of the AC input, thus permitting modulation during each half cycle of the AC input.

Sawtooth generators in order to provide the required type of sawtooth must be adjusted from time to time to maintain the requisite equal bipolar excursion of predetermined amplitude and the required frequency relationship. Such adjustment is required because of tolerance variations of the components of the generator, and because of changes of the frequency of the AC input, e.g. 50 cycle vs. 60 cycle operation.

OBJECTS OF THE INVENTION

It is an object of the invention to provide an improved sawtooth generator providing waveforms of equal bipolar excursions of predetermined amplitude and of frequency accurately related to the frequency of an AC input signal.

It is a further object for such a generator to provide waveforms of the specified characteristic without requiring adjustment.

It is a yet further object to provide a sawtooth generator wherein the bipolar excursion of the waveforms are automaticallymaintained to be equal.

SUMMARY OF THE INVENTION

The sawtooth generator comprises pulse generating means, such as for example, a zero crossing detector which, responsive to an AC signal, produces a train of unidirectional pulses having a predetermined frequency relationship with the frequency of the AC signal. First integrating means responsive to the pulses integrates in a first direction to produce at its output rapid potential excursions in a first direction, whose amplitude is limited to a predetermined level by voltage limiting means. A source of DC is coupled to the input of the first integrating means to produce integration in a second direction during the interval between pulses to produce at the integrator output gradual potential excursions in a second polarity direction. The sawtooth waveform output of the first integrating means is applied to second integratng means having a long R-C time constant in respect to the pulse frequency. The output of the second integrating means produces an error signal which is coupled to the input of the first integrating means so as to reduce amplitude differences between the bipolar excursions of the sawtooth waveform.

The novel features believed characteristic of this invention are set forth with particularity in the appended claims. The organization and manner of operation of the invention, together with further objects and advantages thereof, may best be understood by reference to the following description taken in connection with the accompanying drawings. These disclose the invention in connecion with its application to a precipitator system. Particular attention is directed to the section of the specification entitled "Sawtooth Generator" and to the sawtooth generator circuit illustrated in the dashed line block 37 of FIG. 2. The precipitator system described herein also contains additional features which are the subject of other co-pending applications (Dockets 41-IYO-2366 and 41-IYO-2386). The subject invention may, of course, be applied to other than precipitator systems.

BRIEF DESCRIPTION OF DRAWINGS

FIG. 5(ti a) through (f) are representations of waveforms appearing at designated portions of the phase control comparator;

DESCRIPTION OF THE PREFERRED EMBODIMENT

For convenience, the description of the preferred embodiment is divided into the following subheadings:
1. Description of Precipitator Block Diagram and of the Arc Detector,
2. Spark Detector,
3. Current Reference Generator,
4. Difference Amplifier,
5. Sawtooth Generator,
6. Turn-Off and Recovery Circuit,
7. Phase Control Comparator and Phase Control Oscillator,
8. Current Limit and Interruption Circuit.

DESCRIPTION OF PRECIPITATOR BLOCK DIAGRAM AND OF THE ARC DETECTOR

Figure 1:
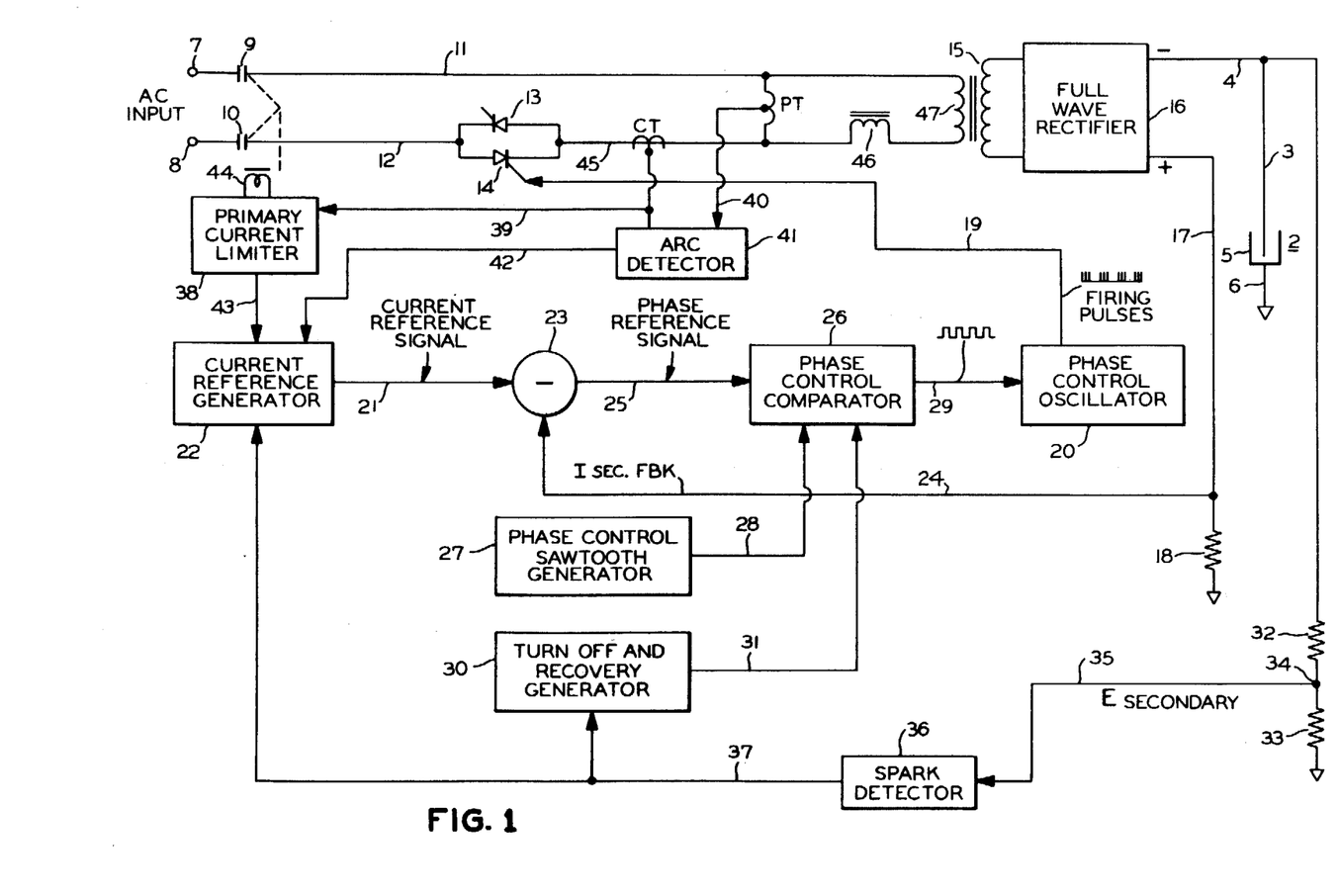
FIG. 1 is a block diagram of a precipitator system incorporating a preferred embodiment of the invention.

Attention is directed to FIG. 1, a block diagram of the precipitator system and its associated control. A precipitator 2 conventionally has wires 3 connected to a negative source of high DC potential by means of line 4 and plates 5 connected to ground by line 6. Power is provided to input terminals 7 and 8 from a source, such as 440 volts, 60 cycles. Input terminals are coupled through contact tips 9 and 10 of a circuit breaker with contact 9 connected by line 11 to one end of the primary winding 47 of a high voltage transformer. Contact 10 is connected by line 12 to a conventional phase control circuit illustrated as incorporating back to back connected silicon controlled rectifiers 13 and 14. The output of the phase control circuit is connected by line 45 via reactor 46 to the other side of transformer primary winding 47. The secondary winding 15 is conncted to the input of a full wave rectifier 16 which typically comprises a diode bridge circuit. The negative output terminal of the rectifier is connected by line 4 to wire 3 of the precipitator and the positive output is connected by line 17 and series connected resistance 18 to ground.

Precipitator operation is controlled by adjustment of the precipitator electrode potential and current by appropriate phase control of silicon rectifiers 13 and 14. Phase control oscillator 20 supplies firing pulses for application to the gate of silicon controlled rectifiers 13 and 14. For simplicity, firing pulses are illustrated only as being supplied by line 19 to the gate of silicon controlled rectifier 14. It should be understood, of course, that similar firing pulses displaced in phase are applied from phase control oscillator 20 to the gate of silicon controlled rectifier 13. The system is principally controlled by a current reference signal produced by current reference generator 22 and applied by line 21 to difference amplifier 23. Although reference has previously been made to controlling the voltage applied to the precipitator, this voltage produces the corona current from the precipitator wires to the plate and it is desirable to control this corona current. Accordingly, the precipitator, or transformer secondary current, is controlled. Secondary current flows through resistor 18, the resulting voltage on line 17, representative of precipitator, i.e. secondary, current is applied by line 24 to a second input of the difference amplifier 23. The resulting difference between the current reference signal on line 21 and the secondary current feedback on line 24, the phase reference signal, is supplied by line 25 to phase control comparator 26. Phase control sawtooth generator 27 generates sawtooth waveforms which are synchronized in time duration to the alternating current input frequency, e.g. 60 cycles, and which have equal and opposite excursions of predetermined magnitude from a reference potential, e.g. zero volts. These sawtooth waveforms are supplied to the phase control comparator by line 28. The phase control comparator modulates the sawtooth and phase reference signals to produce a gating signal on output line 29 which is provided to phase control oscillator 20. The phase control oscillator produces firing pulses during the duration of the enabling gate signals supplied by the phase control comparator. As will be explained subsequently, turn-off and recovery generator 30 produces a turn-off and recovery signal on line 31 which is also supplied to the phase control comparator in order to modify the enabling gate output signal on line 29.

The current reference generator comprises an integration circuit which produces a substantially linearly increasing current reference signal on line 21. Accordingly, the phase reference signal on line 25 would normally be increased. The firing pulse output from phase control oscillator 20 is thus advanced so as to result in greater conduction of the silicon controlled rectifiers 13 and 14 with a resulting increase in precipitator electrode potential and current. This ultimately results in a spark across precipitator elements 3 and 5.

Figure 3:
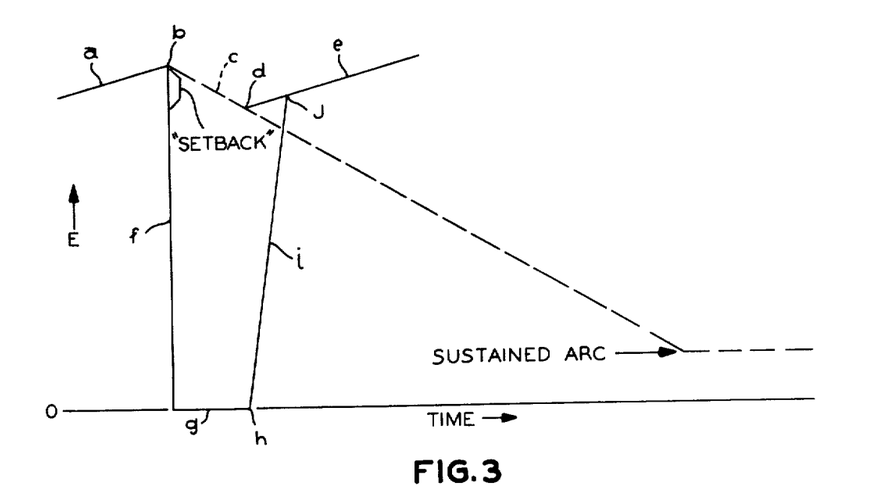
FIG. 3 is a graphic representation of waveforms illustrating the effect of the signal output of the current reference generator and of the signal output ofthe turn off and recovery circuit on operation of the precipitator.

Upon occurrence of the spark, the electrode voltage which may, for example, be in the range of 50,000 – 80,000 volts, decreases sharply to near zero volts within about 1 millisecond. This drastic reduction in secondary voltage is utilized to provide a spark detection signal. Line 4, which connects precipitator wire 3 to the negative output of rectifier 16, is also connected by series connected resistors 32 and 33 to ground. The junction 34 of these resistors is coupled by line 35 to the input of spark detector 36. Resistor 32 has a substantially higher magnitude than resistor 33 so that the output voltage on line 35 is at a relatively low potential in respect to the negative precipitator electrode voltage. For example, resistor 32 may be 80 megohms whereas resistor 33 may for example be 10,000 ohms. Thus, for example, with a potential drop of approximately 80,000 volts resulting from a spark, the signal on line 35 would have a potential of 10 volts. This transient signal on line 35 is processed by spark detector 36 so as to produce on line 37 an output pulse having a predetermined pulse width and amplitude. This spark pulse is applied to the turn-off and recovery generator 30 and is additionally applied to the current reference generator 22. During the time duration of the spark pulse, the integrator in the current reference generator integrates in an opposite direction such that the current reference signal is reduced to a lesser value. Upon termination of the spark pulse, the integrator resumes its normal upward integration and the current reference signal again increases. Reference is made to FIG. 3 for an illustration of how the current reference signal varies as a function of a detected spark. During normal operation of the integrator, the current reference signal increases linearly at a low rate, such as for example, increasing from a minimum to maximum voltage over a time period of from 1 to 10 minutes. This increase of the current reference signal is illustrated by solid line portion $a$ of FIG. 3. Upon occurrence of a spark, the spark detector pulse is applied to the current reference generator for a predetermined time period, such as for example, 10 milliseconds. In FIG. 3 the initiation of the spark pulse is indicated at point $b$ and its termination occurs at point $d$. During the occurrence of the spark pulse, the current reference signal is reduced and decreases as shown by dashed line segment c. Subsequent to the termination of the spark pulse at point d, integration resumes in the normal direction and the current reference signal resumes its upward ramp, as shown by line segment e. It should be noted that the set back of the current reference signal results in only a small voltage decrease at the precipitator electrode. For example, a one to ten percent reduction of the maximum precipitator voltage.

In order to assure that the precipitator ionization current is adequately quenched upon occurrence of a spark, the spark pulse on line 37 is additionally applied to turn-off and recovery generator 30. Circuit 30 produces an output on line 31 so as to substantially and instantly cut off conduction of the silicon controlled rectifiers 13 and 14 upon occurrence of a spark. Rectifier conduction is cut off for at least the duration of the spark pulse and then is increased at a pre-established rate. Line f of FIG. 3 illustrates the reduction of electrode potential resulting in cut off of the silicon controlled rectifiers upon initiation of the spark pulse. Cut off is maintained, as indicated by line segment g to point h. At point h, conduction is gradually reestablished as indicated by line segment i until the precipitator electrode voltage reaches the instantaneous level established by the current reference ramp at point j. Thereupon, the electrode voltage increases at the predetermined slow rate as shown by line segment e.

Thus, the current reference generator 22 acts as a ramp generator producing an increasing current reference signal which is combined with the secondary current feedback signal in order to produce a phase reference signal. The latter is applied to the phase control comparator which produces enabling pulses which are applied to the phase control oscillator to provide firing pulses for advancing firing of the silicon controlled rectifiers and thus to increase electrode potential and ionization current. Upon occurrence of a precipitator spark, the resulting secondary voltage transient causes spark detector 36 to produce an output pulse of predetermined magnitude and time duration. This causes the current reference generator to be set back by a small predetermined amount and to subsequently resume its upward ramp at a low predetermined rate. The turn-off and recovery generator supplies a signal, responsive to the spark pulse, to the phase control comparator which modifies the gate output of the phase control comparator on line 29 to turn the silicon rectifiers off completely for a predetermined time equalling at least the duration of the spark pulse and then to increase the electrode potential at a rapid rate up to the instantaneous voltage level established by the current reference ramp signal. The cut off time and the time for recovery must be selected for the particular type of precipitator system and for the type of effluent passing through the precipitator. The recovery slope is chosen so that on the one hand there is a rapid return to the high electrode potential established by the current reference signal. This provides for maximum precipitation efficiency by retaining the electrode potential near the sparking level for a maximum period of time. On the other hand, the recovery slope is sufficiently low to prevent an excessively rapid turn on of the silicon controlled rectifiers. I have found it desirable to match the turn-off time and the recovery time such that the two are proportional to one another, and to provide for obtaining the correct ratio of recovery time to turn-off time by means of a single adjustment.

Primary current limiter 38 protects the precipitator system against damage resulting from overload. The limiter assures that current on the primary side of the high voltage transformer does not exceed a predetermined maximum value. It thus protects the system against failure such as short circuits in the silicon controlled rectifier, reactor and transformer. Additionally, the primary current limiter acts to prevent precipitator current from reaching destructive levels. There is not necessarily a constant ratio between the primary and secondary current, since this ratio may change as a function of the phase angle of the silicon controlled rectifiers and of other operating characteristics. Accordingly, the primary current is sensed so that remedial action is taken by the silicon controlled rectifier phase control circuit toward preventing the primary current from exceeding a predetermined maximum, and if that is unsuccessful, circuit breakers 9 and 10 are tripped. The latter action may be required in the case of short circuits in the precipitator system. Current transformer CT coupled to input line 45 provides a primary current signal on line 39 to primary current limiter 38. If the primary current approaches the predetermind current limit, a current limiting signal is applied by the limiter output line 43 to the current reference generator. This modifies the current reference signal so as to retard the firing of the silicon controlled rectifiers 13 and 14. Thus, there is a primary current limiter loop comprising the current transformer, the primary current limiter, the current reference generator, the difference amplifier, phase control comparator, phase control oscillator and the silicon controlled rectifiers. If for some reason, such as for example because of shorts, this loop is unable to maintain primary current below the reference limit, the primary current limiter 38 actuates the solenoid 44 of the circuit breaker so as to open contacts 9 and 10. As subsequently described, the primary current limiter circuitry provides the current limit signal on line 43 as well as tripping the circuit breaker. This permits tripping the breaker precisely on the desired time-current trip characteristic line.

Figure 7:
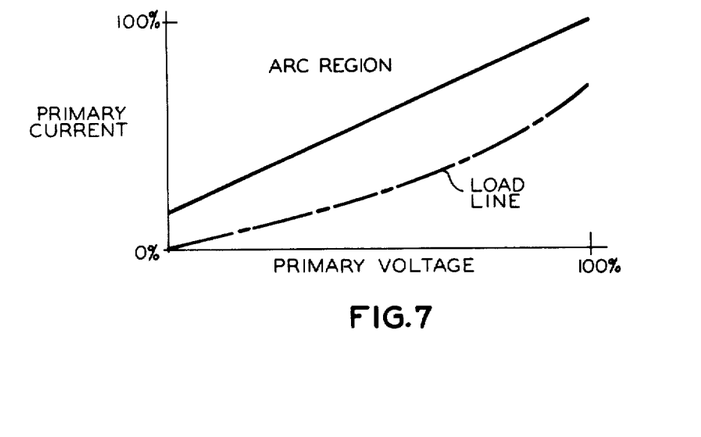
FIG. 7 is an illustration of the current and voltage responsive detection characteristics of the arc detector.

While the primary current limiter will prevent excess primary current which could damage the equipment and the spark detector provides for brief reduction of electrode potential responsive to sparks it is additionally desirable to reduce electrode potential and precipitator current while an arc occurs. This arcing may occur, for example, if a precipitator wire breaks and falls against the precipitator plate or, conceivably, in the event the spark detector should fail to inhibit the production of an arc. In such an event it is desirable to reduce precipitator electrode voltage until the condition clears, instead of driving the system at the current limit. For this purpose arc detector 41 provides a signal on line 42 to current reference generator 22 to modify the current reference signal and thus to retard firing of the silicon control rectifiers 13 and 14 during the duration of an arc. Whereas the spark detector is responsive to the transient, i.e. the rate of change, of electrode potential upon initiation of a spark, the arc detector 41 is continuously responsive to the precipitator system voltage and current and provides an output signal while the ratio of voltage to current is indicative of the existence of arcing conditions. Current transformer CT supplies a primary current signal to the arc detector on line 39 and potential transformer PT provides a primary voltage signal to the arc detector on line 40. The arc detector is preferably of the type disclosed in U.S. Pat. No. 3,873,282 of David C. Finch, assigned to the assignee of this application. Since the circuit details are illustrated in FIG. 1 and described in colume 5 of the Finch patent they are not illustrated in the present application. The arc detector preferably comprises means for converting the CT current signal to a DC signal proportional to primary current, such as a first bridge rectifier supplied with the primary current signal output of the current transformer or an RMS to DC converter, and a second bridge rectifier supplied with the primary voltage signal output of the potential transformer. The current and voltage outputs from the respective rectifiers are introduced into separate input terminals of a differential amplifier which generates either a positive or negative voltage output responsive to the ratio of the applied voltage and of the applied current signals. A balance potentiometer between the output of one of the bridges and one input of the difference amplifier may be adjusted so that the polarity of the amplifier voltage output indicates the arcing or non-arcing states of the precipitator. The output of the differential amplifier may be coupled to a suitable shaping circuit which provides a zero voltage output during non-arcing states and a discreetly different voltage output during arcing states. This output is provided by line 42 to current reference generator 22. The arc detector operates on the principle that there is normally a direct relationship between electrode potential and electrode current. Thus an increase of precipitator voltage results in an increase of precipitator current. However an arcing condition is manifested by a substantial decrease in voltage accompanied by a substantial increase in precipitator current. Reference is now made to FIG. 7 wherein the dash dot line illustrates a typical normal precipitator load line. Numerous parameters associated with the precipitation process cause continuous variations of this load line. The solid line of FIG. 7 illustrates the selected switching characteristic of the differential amplifier output. This line is set suitably above any reasonably expected variations in precipitator load lines. The area above the solid line is termed the arc region and any combination of primary voltage and primary current resulting in a point within the arc region provides an arc signal output on line 42. Since primary voltage is plotted on the ordinate and primary current is plotted on the abscissa, the arc region encompasses operations of the precipitator system wherein the current is sufficiently high and the voltage is sufficiently low to clearly indicate the existence of arcing. The arc detector therefore, unlike the spark detector, provides an output signal indicative of arcing during the full duration of the arc. However, because of the normally encountered variations in the precipitator load line, the solid line defining the arc region must be high enough, i.e. at a high enough ratio of primary current to primary voltage, to prevent production of an arcing signal under situations when there is no arc. Therefore, the arc detector does not provide as sensitive an indication of sparking as the spark detector.

Initiation of an arc produces a drastic change of precipitator voltage which is detected by spark detector 36. As previously described this not only causes a setback in the current reference signal, but also results in the application of a turn-off and recovery signal from turn-off and recovery generator 30 to phase control comparator 26 so as to cut off silicon control rectifiers 13 and 14 for a predetermined time interval. As was described in connection with FIG. 3 the spark pulse produced by spark detector 36 causes the current reference generator to modify the current reference signal only by a small predetermined setback during the time duration of the spark pulse. As illustrated in FIG. 3, dash line segment c occurs between the initiation of the spark pulse at point b and terminates at the termination of the spark pulse at point d whereupon the current reference signal commences its upward ramp. However, if an arc is detected, an arc signal is supplied on line 42 to the current reference generator during the duration of the arc. This results in a continued decline of the ramp voltage beyond point d, as illustrated by the dashed line which extends downwardly from point d. The ramp declines downwardly until the termination of the arc signal whereupon the upward ramp is resumed. However, the ramp declines downwardly only to a predetermined minimum level whereupon the ramp signal remains at such minimum level until the termination of the arc. This level, identified as "sustained arc" in FIG. 3 may for example represent a precipitator electrode voltage of about 10% of the sparking level.

Thus upon occurrence of an arc the turn off signal on line 31 causes the silicon controlled rectifiers to be cut off and to be rapidly phased back up, as indicated by solid line segment i of FIG. 3, until the precipitator electrode voltage is at the level established by the ramp signal, i.e. the intersection of line segment i and the downwardly extending dashed line. Thereupon during the duration of the arc the electrode voltage continues to decrease to the minimum sustained arc level and to remain at such level until the arc terminates. Therefore, precipitator power is reduced to minimal levels during occurrence of an arc. A timing device may be used to cut off power if the arc is not extinguished within a predetermined time interval. For purposes of circuit protection, the ramp could decline, and the electrode potential could be reduced to zero. However, by limiting electrode potential to a predetermined minimum level, sufficient power continues to be provided to the precipitator system such that the arc detector continues to function and the arc detector signal remains until the arc has actually terminated. Thus maintenance of power at a low level permits detection of when the arc clears. As subsequently described, the minimum arcing level may be attained by a suitable clamping circuit in the current reference generator.

Figure 2:
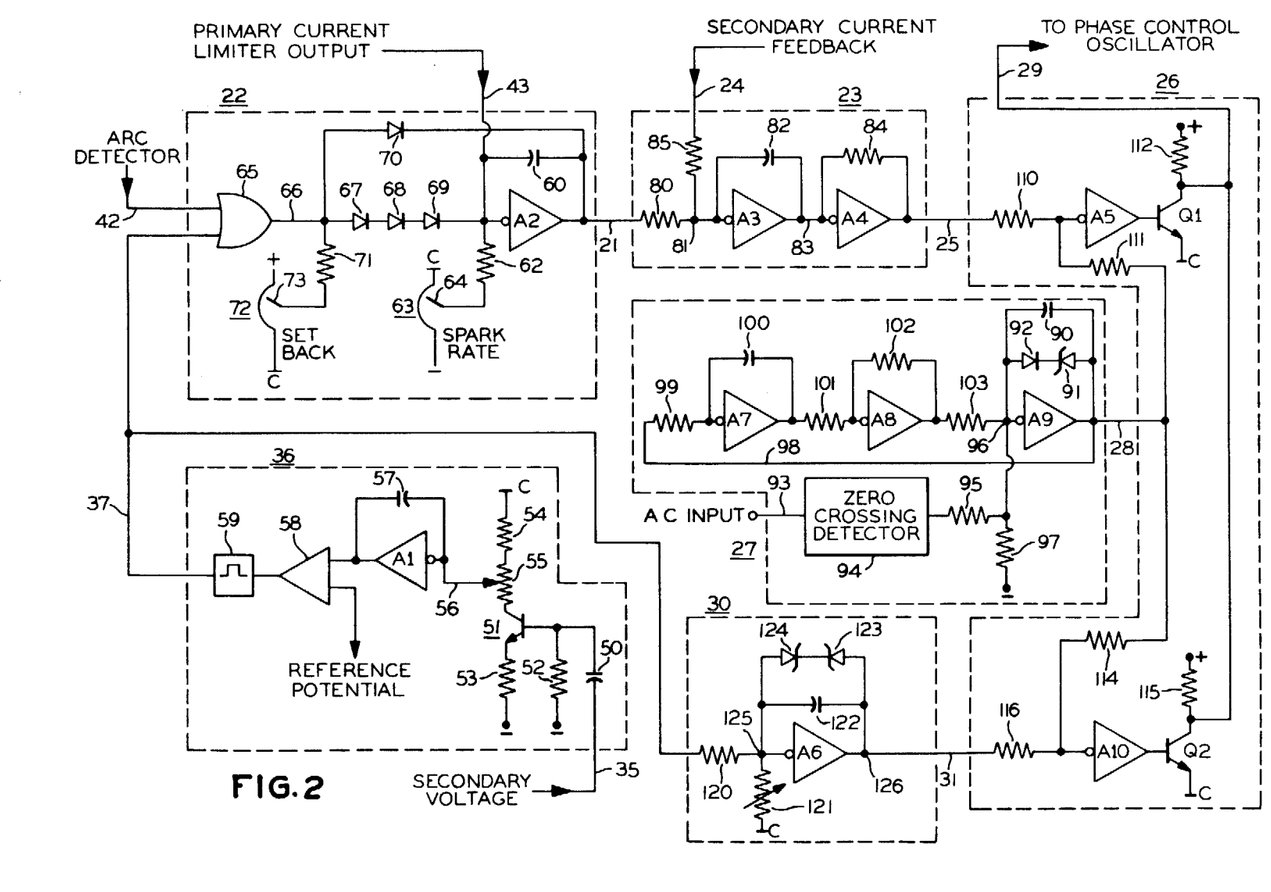
FIG. 2 is a simplified schematic of designated portions of the precipitator system of FIG. 1, including the spark detector, current reference generator, difference amplifier, sawtooth generator, turn off and recovery circuit, and phase control comparator.

For a detailed description of circuit components, attention is now directed to FIG. 2.

SPARK DETECTOR

The secondary voltage signal on line 35 is applied to the input of the spark detector 36. Since a spark causes the electrode potential to drop drastically from a very high level, such as, for example, from between 50 Kv to 80 Kv to near zero volts, the scaled down secondary voltage signal on line 35 similarly has a substantial excursion, such as for example, from approximately minus 10 volts to zero volts. Upon termination of the spark or arc condition the precipitator voltage rises again to the sparking level, and the secondary voltage similarly rises back again to its quiescent amplitude in the range of minus 10 volts.

Line 35 is coupled through capacitor 50 to the base of transistor 51. A resistor 52 is connected from the base to a negative source and a resistor 53 is connected from the transistor emitter to the negative source. The collector is connected through serially connected potentiometer 55 and resistor 54 to a common terminal. The arm 56 of potentiometer 55 is connected to the input of operational amplifier A1 whch has an integrating capacitor 57 connected between its input and its output. The output of integrating amplifier A1 is connected to one input of comparison amplifier 58 whose other input is connected to a source of reference potential. The output amplifier 58 is applied to monostable multivibrator 59 which has its output connected to line 37.

Capacitor 50 and resistor 52 constitute a differentiating circuit. The collector signal or buffer transistor 51 thus has an amplitude proportional to the amplitude of the differentiated signal which in turn is proportional to the amplitude of the voltage differential of the precipitator electrode as well as its slope of decrease. The output of integrating amplifier A1 therefore is a function of the area under the differentiated signal and thus its amplitude is representative of both the magnitude of the voltage drop and of its duration. If the amplitude of the output of A1 exceeds the reference potential, comparison amplifier 58 gates device 59. Monostable multivibrator 59 thus produces an output pulse of predetermined time, such as for example 10 milliseconds, and of predetermined voltage, in response to an integrator output having at least a predetermined magnitude. The time constant of the differentiating circuit is made short enough so that the integrator output has insufficient amplitude to trigger the multivibrator in response to very short duration sparks. These very short sparks are termed self-quenching sparks because they have insufficient time duration to result in sustained arcing. By discriminating against such self-quenching sparks, the spark detector avoids the needless turn-off of the silicon controlled rectifiers and thus increases the efficiency of operation. However, the time constant of the differentiating circut must be long enough to allow for the rate of fall of secondary voltage responsive to a spark. Certain types of precipitators, such as water type of precipitators have a much slower rate of fall than dry types. In one embodiment of the invention, a time constant of one-half of a millisecond provided adequate results for both types of precipitator systems.

Figure 6:
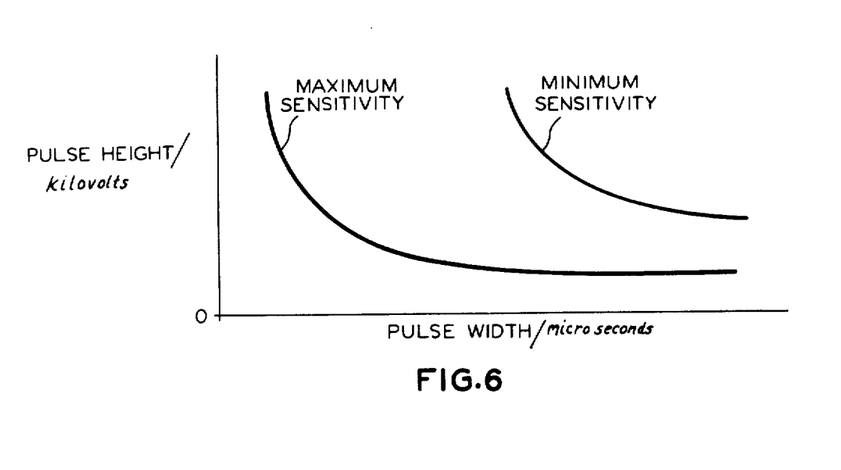
FIG. 6 is a graphic illustration of the time and voltage detection sensitivity of the spark detector, and the effect of the spark sensitivity control.

Thus the precipitator electrode voltage signal is differentiated, the differentiated signal is integrated, and the amplitude of the integrated signal output is compared by device 58 with the reference potential. In the event the amplitude of the integrated signal exceeds the reference potential the pulse generator produces a spark pulse of predetermined magnitude and width. Spark pulses are produced only if the precipitator spark has at least a minimum predetermined pulse width, such as for example 10 microseconds, and additionally has at least a minimum pulse height, such as for example 20 Kv. FIG. 6 illustrates the effect of the spark sensitivity potentiometer 55 whose setting varies the hyperbola of sparks which will be detected to produce a spark pulse. In FIG. 6 pulses located on the inside of the hyperbola are detected whereas those on the outside are not. Adjustment of potentiometer arm 56 to its lowermost position provides maximum sensitivity resulting in the direction of pulses having minimum pulse height and minimum pulse width. Conversely, setting of the arm to its uppermost position provides minimum sensitivity and a spark pulse is produced only with sparks having a greater pulse width and pulse height. Thus a single control, potentiometer 55 may be adjusted to provide the desired spark sensitivity for the particular precipitation process.

CURRENT REFERENCE GENERATOR

Spark pulse line 37 and arc detector line 42 are connected to the input of current reference generator 22, and specifically to the input of open collector device 65 which performs an OR function. The output of device 65 is connected by line 66 to the anode of diode 67. The cathode of diode 67 is serially connected through similarly poled diodes 68 and 69 to the input of operational amplifier A2 whose output supplies the current reference signal on line 21 to the difference amplifier. Operational amplifier A2 constitutes an integrating circuit with capacitor 60 connected across its input and output. A "spark rate" potentiometer 63 has its end terminals connected between common and a source of negative potential and its wiper arm 64 is connected through resistor 62 to the input of amplifier A2. Primary current limiter line 43 is additionally connected to the junction of resistor 62 and of the input of A2. Diode 70 has its cathode connected to the output to A2 and its anode to the junction of line 66 and the anode of diode 67. A "setback" potentiometer 72 has its end terminals connected between common and a source of positive potential and its wiper arm 73 connected through resistor 71 to the junction of line 66 and the anode of diode 67.

During normal operation of the current reference generator, input current flows from the source of negative potential through spark rate potentiometer 63 and resistor 62 to the input of integrating amplifier A2 causing the output of the integrator, i.e. line 21, to increase in a positive direction. The integrator has a long time constant which may be set, for example, to cause the output to ramp up at a rate requiring up to 10 minutes for the electrode potential to rise from zero volts to the maximum level. Adjustment of the spark rate potentiometer 63 controls the slope of the integrator output signal and therefore controls the frequency of precipitator sparking.

In the event the primary current of the precipitator exceeds a predetermined magnitude the primary current limiter produces current flow in line 43, in opposition to the current in resistor 62, so as to reduce the magnitude of the current reference signal on line 21 and to maintain primary current within the maximum allowable limit. During the above-described operation, components 66 through 73 do not affect operation of integrating amplifier A2. Current flows from potentiometer 72 through resistor 71 and line 66 to open collector device 65. Line 66 is normally maintained at a predetermined low level.

Responsive to a precipitator spark a spark pulse is applied by line 37 to the input of device 65 causing the output of the latter to rise to a predetermined high level for the predetermined time duration of the spark pulse. This results in current flow through potentiometer 72 and resistor 71 being switched and diverted from line 66 and device 65 and instead flowing through diodes 67 through 69 to the input of A2 in a direction opposite to the direction of current flow through resistor 62. As previously described in connection with FIG. 3, the current reference signal thus commences to decrease upon initiation of the spark pulse and to continue its decrease until the termination of the spark pulse. Since this setback occurs during the predetermined time interval of the spark pulse, the setback voltage, i.e. the difference of potential between points b and d of FIG. 3, is established by the slope of the setback ramp. This slope in turn is established by the time constant of the integrating circuit of operational amplifier A2. During setback current flows from a positive potential source through setback potentiometer 72 and resistor 71 through diode 67 through 69 to the operational amplifier A2. Therefore, the setting of arm 73 of potentiometer 72 determines the slope of the setback, and thus the setback voltage. The time constant may be selected such that the downward ramp has a somewhat greater slope than the upward ramp, for example, providing for a decrease from full precipitator current to zero in about one second. It may thus be seen that the current reference generator has two adjustments which act independently of one another. The spark rate potentiometer adjusts the slope of the upward ramp, and the setback potentiometer adjusts the slope of the downward ramp, and therefore the setback potential.

If an arc occurs a signal is supplied from the arc detector on line 42 to device 65 for the duration of the arc. The arc signal produces the same results as the spark pulse signal causing the output of the device 65 on line 66 to switch to a predetermined positive level, to divert the current flow in potentiometer 72 and resistor 71 through diodes 67 and 69 so as to cause a downward ramping action at the output of integrating amplifier A2. Actually an arc is initiated by a sharp reduction of precipitator electrode potential which produces a spark pulse on line 37 which by itself is sufficient to change the state of the output of device 65. The difference between the spark pulse and arc signal application to device 65 is that the output of device 65 instead of switching back to its low state upon termination of the spark pulse remains at its high state until the termination of the arc signal on line 42. Therefore, the current reference signal continues to ramp down, beyond the termination of the spark pulse, until the arc terminates. This occurs because the high level on the output of device 65 enables continued current flow through potentiometer 72, resistor 71 and diodes 67 through 69. However as previously explained, it is desirable to limit the downward ramping action to some small predetermined level, such that the precipitator electrode potential is maintained at some small voltage identified in FIG. 3 as the sustained arc level. This is accomplished by clamping action of diodes 67 through 70. Reference is made to FIG. 3. Assume for purposes of explanation that downward ramping commences at point b) and that at such point the current reference signal on line 21 is approximately 8 volts. Further assume that it is desired to limit the minimum current reference signal under sustained arc conditions to 1 volt. During the presence of an arcing signal on line 41 the current reference signal continues its downward ramp along the dashed line segment of FIG. 3, resulting in the continued decrease of the current reference signal voltage. Assume further that the anode to diode potential of each of the diodes 67 through 70 is .5 volts. Thus the potential difference across the three diodes 67 through 69 is 1.5 volts, i.e. line 66 is 1.5 volts positive in respect to the input of A2. When the output of integrating amplifier A2 has dropped to 1 volt, diode 70 clamps the output of A2 to that level, and prevents further decreases in A2 output voltage.

DIFFERENCE AMPLIFIER

In difference amplifier 23, the current reference signal on line 21 is supplied through resistor 80 to the input 81 of operational amplifier A3. In addition, the secondary current feedback signal on line 24 is applied through resistor 85 to the same input, 81, of A3. Capacitor 82 is connected between input terminal 81 and output line 83 of A3. The output of A3 is connected by line 83 to the input of operational amplifier A4 whose output, line 25, provides the phase reference signal. Resistor 84 is connected between the input and the output of A4. Operational amplifier A3 is an integrating amplifier having a long time constant whose input essentially consists of the difference between the current reference signal and the secondary current feedback signals. The output of the integrating amplifier is applied through inverting amplifier A4 to provide the phase reference signal. Because of the long time constant of A3, the phase reference signal represents the precise difference of the current reference signal and of the secondary current feedback signal.

SAWTOOTH GENERATOR

The sawtooth generator 27 comprises main integrating amplifier A9 having resistor 97 connected from a source of negative potential to its input 96 and an integrating capacitor 90 connected from its input 96 to its output, i.e. line 28. Additionally series connected diode 92 and Zener diode 91 are connected in parallel with capacitor 90. An alternating current input is coupled by line 93 to the input of zero crossing detector 94, whose output is connected via resistor 95 to the input 96 of A9. The output of A9 is connected by line 98 and resistor 99 to the input of operational amplifier A7. The latter has a capacitor, 100, connected across its input and output so as to constitute a long time integrating amplifier. The output of A7 is connected through resistor 101 to the input of operational amplifier A8 and resistor 102 is connected between the inputs and outputs of A8. The output of inverting amplifier A8 is connected by resistor 103 to the input terminal 96 of A9.

Figure 5:
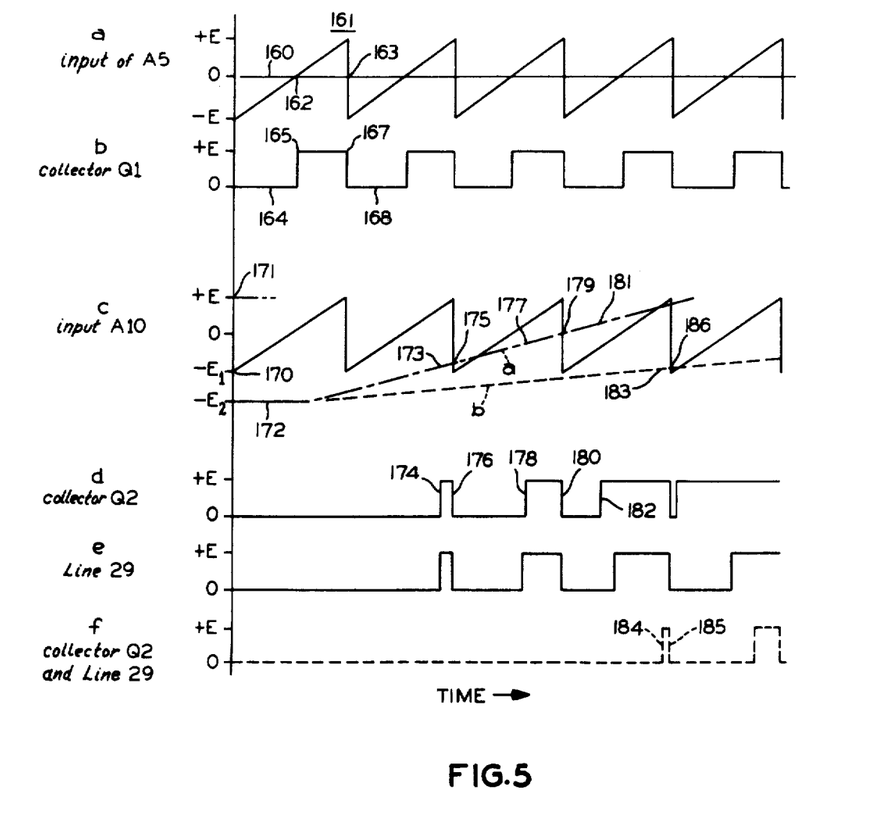

As previously described in connection with FIG. 1, the sawtooth generator provides a sawtooth waveform via line 28 to the phase control comparator 26. This sawtooth ramp must be time synchronized with the AC input to the precipitator and it must have equal bi-polar excursions of predetermined amplitude. Reference is made to FIG. 5a which illustrates a sawtooth 161. The time synchronization requirement requires that the time duration of one sawtooth precisely equals the time duration of one-half cycle of the AC signal. The time duration of one-half cycle of a signal having a frequency of 60 cycles is 8.33 milliseconds. For such an AC signal the sawtooth would have to have an 8.33 millisecond time duration. Further the sawtooth should have equal positive and negative maximum excursion from a reference axis, e.g. zero volt. For purposes of explanation only, reference is made hereinafter to a sawtooth having positive excursion of plus seven volts and a negative excursion of minus seven volts.

AC input line 93 is coupled to the AC input, e.g. line 12 of FIG. 1, and this AC input is applied to zero crossing detector 94. Devices of this type, which are well known in the art, produce a pulse of short time duration each time the AC signal passes through the zero axis. This pulse is applied by resistor 95 to input of integrator A9. Assuming this pulse to be positive, the integrator output is driven negatively to the breakdown potential of Zener diode 91, e.g. minus 7 volts. Upon termination of the zero crossing pulse the current flow from the negative source through resistor 97 causes the integrator output to gradually increase positively. Diode 92 prevents any positive clamping action, of the Zener diode 91, so that integration, and increase of the output potential of A9, continues until the next zero crossing pulse occurs. At such time the integrator output potential is again sharply reduced to the negative clamping level. While this provides for time synchronization and for a predetermined negative clamping level, there is no control of the positive peak voltage. Accordingly, variations of AC input signal frequency and changes of component or voltage values would result in unequal positive and negative excursions of the sawtooth. The sawtooth output signal on line 28 is connected through line 98 and resistor 99 to the input of integrating amplifier A7 which has a very large time constant in respect to the alternating current input frequency. The output of A7 constitutes the integrated value of the sawtooth. If the sawtooth has equal positive and negative excursions, the A7 output is zero. However, if the excursions are unequal the output of A7 is proportional in magnitude to the error, but inverted in polarity in view of the polarity inversion of the integrating amplifier. The error signal output of A7 is therefore coupled through inverting amplifier A8 to the input 96 of integrating amplifier A9. If, for example, the sawtooth output on line 28 has a greater positive than negative excursion, the output of A7 would constitute a negative signal and the output of A8 would constitute a positive error signal. This produces current flow through resistor 103 opposing the current through resistor 97 so as to decrease the positive peak amplitude of the sawtooth an to thus result in equal positive and negative excursions about the zero axis. Accordingly, integrating amplifier A7 is responsive to the zero crossing of the AC input signal to provide an output having a predetermined magnitude of one polarity and subsequently produces a time varying output until the subsequent zero crossing of the AC input. The A9 integrator output is integrated by A7 to provide an error signal which is applied to the input of integrator A9 to automatically correct the excursions of the sawtooth. The circuit automatically compensates for component initial tolerance variations, time and temperature variations, and also compensates for 50 or 60 Hertz operation without additional adjustment.

TURN-OFF AND RECOVERY CIRCUIT

In turn-off and recovery generator 30, the spark detector line 37 is connected by resistor 120 to the input 125 of operational amplifier A6 whose output 126 is connected by line 31 to the phase control comparator. An integrating capacitor 122 is connected between terminals 125 and 126. Zener diodes 124 and 123 are serially connected back-to-back and have their end terminals connected in parallel with capacitor 122. A variable resistor 121, the turn-off and recovery control, is connected between a common terminal and input terminal 125.

Figure 4:
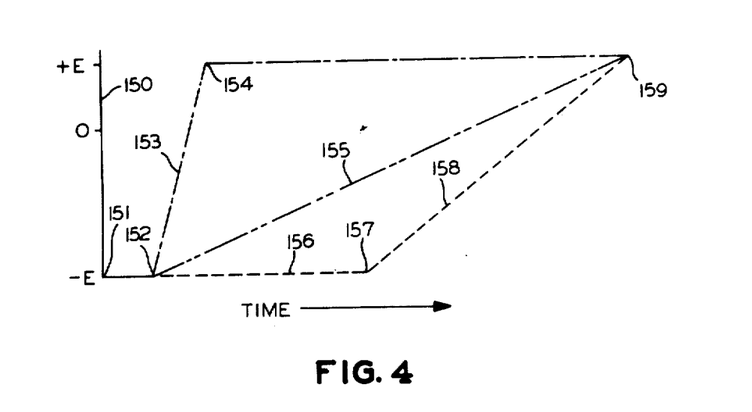
FIG. 4 is a representation of waveforms produced by the turn off and recovery circuit and illustrating their effect on operation of the precipitator.

The recovery and turn-off generator controls turn-off and recovery of the silicon controlled rectifiers upon detection of a spark. As previously described in connection with FIG. 3, responsive to a spark, the precipitator electrode potential and current is cut off as illustrated by line f) of FIG. 3 for a time period g. Subsequent thereto, the SCR's are turned back on at a controlled rate in order to increase electrode potential as shown by line segment i). In order to assure that the ionization current is fully extinguished subsequent to a spark and to avoid multiple sparking, the turn-off time must be properly adjusted for the precipitation process employed. Additionally, the recovery rate must be properly selected. I found it desirable to vary the recovery rate proportionately with the turn-off time and accomplish adjustment of both turn-off time and recovery time by a single control. The turn-off and recovery signal is supplied by line 31 to the phase control comparator where it is compared with a sawtooth waveform supplied by the phase control sawtooth generator to produce a signal which controls turn-off and recovery of silicon controlled rectifiers 13 and 14. Operation of the turn-off and recovery generator will now be described in connection with FIG. 4. The circuit produces on output line 31 a signal which initiates at a predetermined potential. As described in connection with the phase control comparator, it is desirable that this equal the maximum potential of the sawtooth waveform, e.g. plug seven volts. The signal subsequently descends rapidly, as shown by line 150 to a predetermined potential, which exceeds the most negative potential of the sawtooth waveform. If, for example, the sawtooth has a maximum negative potential of minus 7 volts, the maximum negative potential of the turn-off signal, at point 151, may, for example, be minus twelve volts. After a predetermined interval, closely approximating the time duration of the spark pulse, the signal commences to increase at point 152 and linearly increases as shown by dash dot line 153 until it returns to the maximum potential at point 154. It may be noted that this waveform closely corresponds to the turn-off and recovery waveform characteristic previously described in connection with FIG. 3. The arrangement described, however, provides for only brief turnoffs and a very quick recovery period. It is necessary to be able to adjust the system to provide for longer turn-off and recovery periods. This is achieved by modifying the slope of the recovery line 153. As explained below, the slope of the recovery line may be reduced to a predetermined minimum, as, for example, shown by dash dot dot dash line 155. The turn-off and recovery waveform would then extend downwardly from line 150 to minimum voltage at 151 and after the predetermined time interval, at 152 would increase at a slow rate along line 155 until it reached the maximum potential at point 159. As explained in connection with description of the phase control comparator, the last discussed waveform will provide turn-off of maximum duration and recovery of minimal slope. Specifically, it would provide for cut off of the precipitator electrode potential from point 151 of FIG. 4 along dashed line 156 to point 157 and recovery would thereupon take place along dashed line 158. Thus decreasing the slope of the recovery line 153 of the turn-off and recovery signal on line 31 increases both the turn-off time and the recovery time.

Operation of the turn-off and recovery circuit is initiated by a spark pulse. Assuming this to be a positive pulse, its application to the input of A6 through resistor 120 causes the output 126 to be rapidly decreased to the negative potential established by Zener diode 123, for example, minus twelve volts. Upon termination of the spark pulse, current flow from the common terminal through adjustable resistor 121 to input 125 of A6 causes output 126 of the integrating amplifier A6 to gradually increase to the potential established by Zener diode 124, e.g. plus seven volts. The rate of increase of the recovery potential is established by variable resistor 121. Adjustment of this control provides variation of turn-off and recovery, for example, from a minimum having a cut off of 12 milliseconds and recovery of 10 milliseconds to a maximum having a cut off time of 50 milliseconds followed by a subsequent recovery time of 100 milliseconds.

PHASE CONTROL COMPARATOR AND PHASE CONTROL OSCILLATOR

The phase control comparator 26 receives the phase reference signal on line 25, the sawtooth waveform on line 28 and after a detected spark, the turn-off and recovery signal on line 31. The phase reference signal on line 25 is connected through resistor 110 to the input of operational amplifier A5. The sawtooth waveform on line 28 is connected through resistor 111 to the input of A5 and additionally through resistor 114 to the input of operational amplifier A10. A turn-off 116 to the input of A10. The output of operational amplifier A5 is connected to the base of NPN transistor Q1. The output of A10 is connected to the base of NPN transistor Q2. Emitters of both transistors are connected to a common terminal. The collectors of transistors are connected together to output line 29 which is connected to the phase control or gated, oscillator. The collector of Q1 is also connected through resistor 112 to a source of positive potential, and the collector of Q2 is connected through resistor 115 to the positive source.

The phase control comparator produces an output, on line 29, to gate on the phase control oscillator. While such gate signals are applied to the phase control, or gated oscillator, the latter supplies firing pulses to controlled rectifiers 13 and 14 in a manner known in the art.

The phase reference signal on line 25 and the sawtooth waveform signal on line 28 are combined by the operational amplifier A5 input circuit such that a time ratioed pulse output is applied to the base of Q1. The circuit operates such that the base is negative during intervals when the sum of the sawtooth waveform and the phase reference signal exceeds zero volts. FIG. 5a illustrates the input signals to amplifier A5 with the phase reference being illustrated as line 160 and the sawtooth signal as 161. For purposes of illustration the phase reference signal 160 is shown to have a zero volt amplitude. When the net voltage of the sawtooth and of the phase reference signal is more positive than zero volts, i.e. exceeds zero, such as during the interval between points 162 and 163 of FIG. 5a, the output of A5 and the base of transistor Q1 are negative such that the transistor is cut off, and the collector of Q1 is positive during such interval. FIG. 5b illustrates the collector potential of Q1 which is low during conduction intervals 164 and 168 but is high during the interval extending from 165 to 167, which interval is synchronous with the previously referenced interval between 162 to 163 of FIG. 5a. Under the conditions illustrated in FIGS. 5a and 5b, the collector is positive during approximately one-half of each sawtooth, i.e. during each one-half AC cycle. An increase of the phase reference signal results in an increase of the duty cycle and an advanced firing of the silicon controlled rectifiers.

In the event a spark is detected, a turn-off and recovery signal is supplied by line 31 and resistor 116 to the input of A10, where it is combined with the sawtooth signal applied by line 28 through resistor 114. Reference is made to FIG. 5c which illustrates the combination of the sawtooth and the turn-off and recovery signal. Prior to detection of a spark, line 31 is maintained at a potential approximating the maximum potential, +E, of the sawtooth as shown at point 171. Upon occurence of a spark pulse signal, the signal on line 31 is sharply reduced to a predetermined negative potential $-E_2$, which exceeds the maximum negative, $-E_1$, potential of the sawtooth. As previously described in connection with FIG. 4 and operation of the turn-off and recovery circuit, the signal on line 31 remains at this maximum negative potential for a predetermined time period approximating the time duration of the spark pulse, as shown by line 172 of FIG. 5c. Thereupon, the signal on line 31 returns to the maximum positive potential at a rate established by the setting of the control in the turn-off and recovery generator. The dash dot line identified as "a" illustrates a typical slope providing for typical turn-off and recovery time. FIG. 5d illustrates the collector potential of transistor Q2. This is high only during intervals when the sum of the potential of the turn-off and recovery signal and of the instantaneous potential of the sawtooth waveform is greater than zero. Since the turn-off and recovery signal commences from a potential substantially more negative than the sawtooth, the sum of the sawtooth and of recovery line $a$ does not exceed zero volts until the time identified by point 173 of FIG. 5c. The collector potential of Q2 is switched to a high level at 174 of FIG. 5d which is coincident in time with point 173 of FIG. 5c. Collector potential remains at a high potential to the termination of that sawtooth interval whereupon the sawtooth potential rapidly decreases, such that the sum of the sawtooth of line $a$) again decreases below zero at the time identified by point 175 of FIG. 5c. This reduction of Q2 collector potential is identified by line 176 of FIG. 5d. During the subsequent sawtooth cycle, the sum of the line 31 voltage and of the sawtooth voltage again attains zero volts at the time identified by point 177, of FIG. 5c, whereupon the collector of Q2 is switched to a high level, at 178 of FIG. 5d until the subsequent retrace of the sawtooth at 179 of FIG. 5c, results in termination of the positive pulse on the collector of Q2, as indicated by line 180 of FIG. 5d. Subsequently, at point 181 of FIG. 5c, the sum of the potential of line "a" and of the sawtooth rises to zero volts at an earlier time subsequent to initiation of the sawtooth resulting in an earlier rise of collector Q2 voltage as shown by 182 and a wider phase. It may be seen that collector potential of Q2 does not commence to rise until some time after the initiation of the spark pulse. Then, it commences to rise for one pulse interval during each sawtooth. The pulses terminate at the time of the sawtooth retrace, but consecutively commence at earlier times during the duration of the sawtooth. Thus consecutive pulses have increasing time duration. In other words, the duty cycle is gradually increased until the potential of Q2 is continuously positive. The initial time during which the collector potential is entirely at zero characterizes the turn-off time, and the time of increasing duty cycle represents the recovery time, Transistors Q1 and Q2 have their collectors connected in parallel to line 29. Therefore, an enabling gate signal on line 29, causing a pulse output from the phase control oscillator 20 occurs only when both the collector of Q1 and the collector of Q2 are positive. FIG. 5e illustrates the enabling gate signal on line 29 for the conditions of Q1 and Q2 illustrated by FIGS. 5b and 5d. Positive gates appear only during intervals when the collectors of both Q1 and Q2 are positive. Conditions represented by FIG. 5e represent a relatively fast turn-off and recovery period.

Dashed line $b$ of FIG. 5c illustrates a turn-off and recovery signal having a slower rate of return, i.e. the recovery portion $b$ has a lower rate of rise than the recovery portion $a$. FIG. 5f illustrates the resulting collector potential on the time when the retrace of the fourth sawtooth results in the sum of the recovery signal b and of the sawtooth dropping below zero volts at points 186. FIG. 5f only illustrates the initial two collector pulses upon recovery. In view of their short time duration, they both occur during intervals when the collector of transistor Q1 is positive. Thus during the intervals illustrated in FIG. 5f, the phase comparator output signal on line 29 is coincident with the duration of positive pulses on the collector of transistor Q2. Subsequently as the recovery signal b aproaches the maximum voltage, the collector of Q2 will be positive during intervals when the collector of Q2 is negative. Then the phase control signal will differ from the Q2 collector waveform, of FIG. 5f, since the signal on line 29 will be positive only when collectors of both Q1 and Q2 are positive. Thus is can be seen that when the turn-off and recovery circuit is adjusted to have a lower rate of return, turn-off and recovery time are simultaneously extended.

In summary, the phase comparator is responsive to a phase reference signal supplied by line 25, whose amplitude is a function of the desired precipitator electrode current. The phase reference signal is time ratio modulated with sawtooth waveforms, supplied on line 28, having equal bi-polar excursions of predetermined magnitude and a frequency twice that of the AC input, and synchronized therewith. The phase reference signal is time ratioed with the sawtooth waveforms, by a first circuit comprising A5 and Q1, to produce first pulse width modulated signals switched between predetermined first and second voltage levels so as to comprise a first train of pulses synchronous with the frequency of the sawtooth waveforms and having a time duration, and thus a duty cycle, which is a function of the magnitude of the phase reference signal.

Upon detection of a spark, a spark pulse signal of predetermined brief time duration and of predetermined amplitude is supplied to the turn-off and recovery circuit 30. Circuit 30, responsive to the spark pulse signal supplies a turn-off and recovery signal on line 28 to the phase control comparator. The turn-off and recovery signal preferably has a first and rapid voltage voariation of predetermined magnitude, substantially time coincident with detection of the spark. Subsequent to a brief fixed interval, substantially equal to the time duration of the spark pulse, the voltage of the turn-off and recovery signal has a second voltage variation, equal and opposite to the first but of a slower rate of change. This rate of change of this recovery portion of the signal is substantially greater than the ramping rate of the current reference signal and is adjustable to provide for simultaneous and proportionate adjustment of the turn-off time and of the recovery time of the precipitator current subsequent to detection of a spark.

Responsive to detection of a spark this turn-off and recovery signal is supplied by line 31 to the phase control comparator. It is time ratio modulated with the sawtooth waveforms supplied on line 28, by a second circuit comprising A10 and Q2, to produce second pulse width modulated signals switched between predetermined first and second voltage levels so as to comprise a second train of pulse synchronous with the frequency of the sawtooth waveforms. The magnitude of the sawtooth bi-polar excursions and the magnitude of the turn-off and recovery signal voltage variations are predetermined such that the second train of pulses commence only after a turn-off time interval subsequent to the initial variation of the turn-off and recovery signal, i.e. subsequent to the time a spark is detected. Upon initiation of the second train of pulses, the time duration and thus duty cycle, of the pulses increases to a predetermined maximum, i.e. 100 percent duty cycle, establishing the recovery rate of the precipitator electrode current. The time duration of the turn-off interval (when the silicon controlled rectifiers 13 and 14 are fully cut off) and the subsequent recovery time interval during which the duty cycle of the second pulse train increases from zero to 100 percent, (when the SCR conduction angle is increased to the level established by the phase reference signal) are a function of the rate of change of the recovery portion of the turn-off and recovery signal on line 31. Thus a single adjustment in the turn-off and recovery circuit 30 provides for simultaneous and proportionate adjustment of turn off and recovery time.

The outputs, of the above reference first and second circuits, i.e. the first and second trains of pulses, are combined, by common connection of the Q1 and Q2 collectors to line 29, to provide an enabling gate signal for application of the phase control, gated, oscillator 20. The enabling gate signal permitting firing of the phase control oscillator occurs only when pulses of both of the first and second pulse trains have a predetermined polarity. In the preferred embodiment, oscillator 20 produces firing pulses while the collectors of Q1 and Q2 are both positive. Thus essentially the first and second train pulses are applied to an AND circuit, transistors Q1 and Q2, to produce the enabling gate signal.

The phase control, or gating, osciallator operates in known fashion. Preferably it produces firing pulses at an appropriate high frequency, such as for example, 10 kilohertz, during the application of enabling gate pulses on line 29. Although not illustrated, the AC input signal is applied to the phase control oscillator to synchronize firing of the two back-to-back connected silicon controlled rectifiers 13 and 14, such that each of these SCR's is fired during alternate half wave periods of the AC input signals.

CURRENT LIMIT AND INTERRUPTION CIRCUIT

Figures 8, 9:
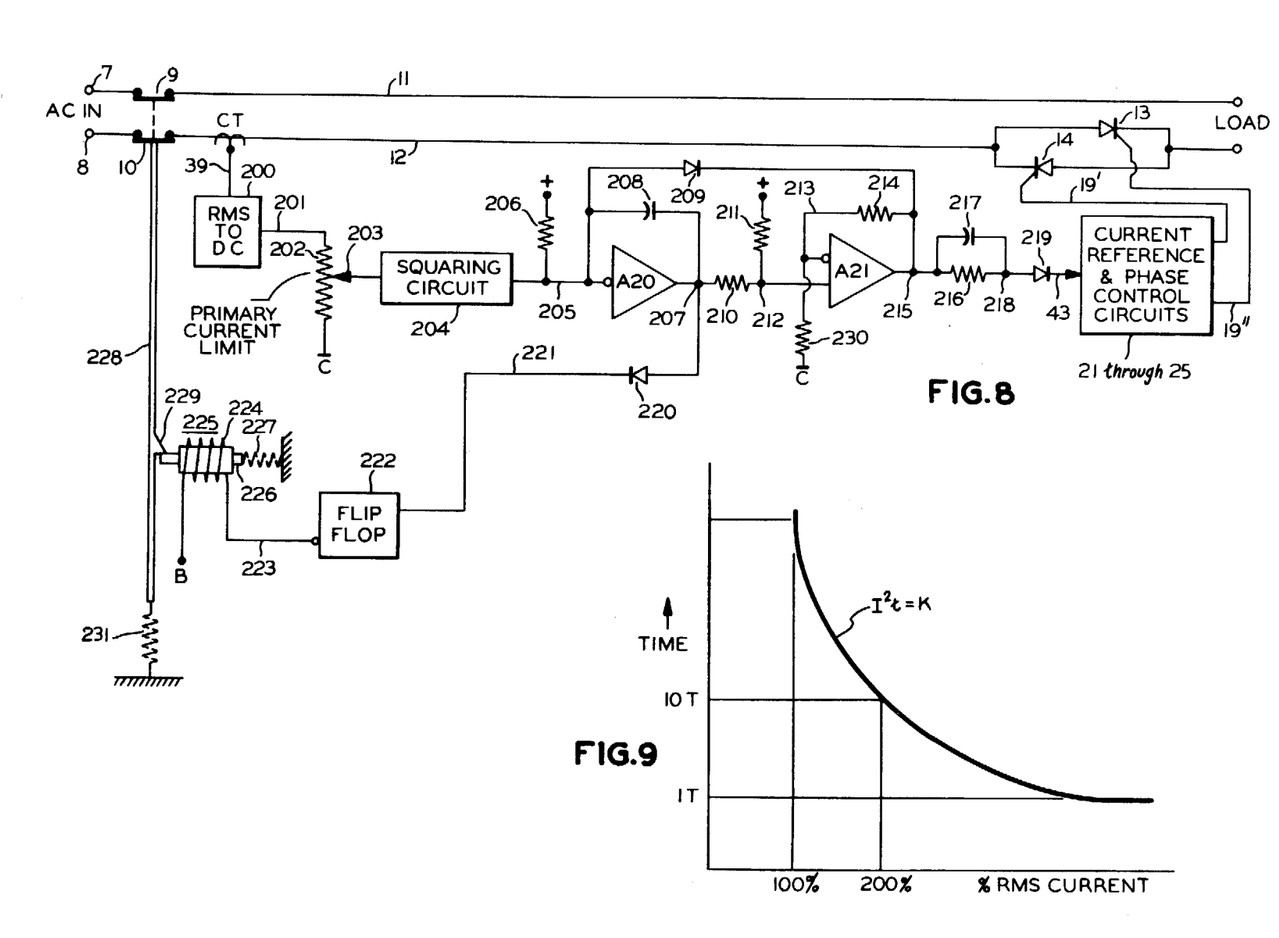
FIG. 8 is a simplified schematic of the current limit and interrupting circuit.
FIG. 9 is a graphic representation of the current limit and current interrupting characteristics of the circuit of FIG. 8.

Current flow in power circuits energizing a sustantial load can normally be maintained below destructive current levels by a current limit loop or feedback circuit prevents the current in the power line from exceeding a predetermined reference current limit value. However, if this current limit regulating circuit is unable to maintain the current within the predetermined limit, for example, because of a short circuit, it is necessary to totally interrupt current to the load carrying circuit, such as for example, by tripping circuit breaker and opening contacts at the input of the power system. It is desirable to protect the components of electric circuits, including their wiring against overload currents by utilizing a cut out or trip circuit having an inverse current function to time relationship. Upon the square of the load current exceeding a predetermined current limit value, tripping occurs after a time interval which is inversely proportional to the square of the current value. Ideally, the product of the square of the current and of the time is equal to a constant. Reference is made to FIG. 9 which illustrates the desired regulating and trip functions. The vertical line identified at 100 percent $I_p$ indicates the desired current limit. As the current in the power system approaches this magnitude, the regulating loop act to limit the current to prevent its exceeding the 100 percent $I_p$ magnitude. Because of short circuits, or other malfunctions, the regulator loop circuit may be unable to maintain the current within this limit. For example, in the case of a precipitator system a short from the anode to cathode of the silicon controlled rectifiers would prevent proper regulation. In such an event, power to the load should be completely disabled when the above described current and time product characteristic exceeds a predetermined constant. FIG. 9 illustrates such a curve which is hyperbolic and asymptotic at its top with the 100 percent $I_p$ line. It is asymptotic at its bottom right with a 1T line. Thus, if the square of the load current $I_p$ has an extremely large magnitude, the power is interrupted instantly. If, however, the square of the load current $I_p$ exceeds the predetermined current limit, 100 percent $I_p$, by a lesser value, the tripping action occurs after a predetermined time interval.

It is undesirable to have the current regulating function and the current trip function performed indeptendently. Due to normal tolerance variatins, the $I^2t = k$ function of a separate trip circuit is likely to deviate from the 100 percent $I_p$ line, so as not to be asymptotic therewith. In order to prevent undesirable power interruption, i.e. tripping of the circuit breaker at current values below the 100 percent $I_p$ magnitude, the $I^2t = k$ curve of a separate trip circuit was typically offset to the right of the 100 percent $I_p$ line of FIG. 9 by some amount, such as 15 percent. This results, however, in excessive and potentially damaging current flow prior to tripping. The current limiting system disclosed herein, however, provides for a unitary regulating and current interrupt or trip circuit such that the current limit regulation and trip circuit characteristic conform to one another in the manner described above.

Reference is made to FIG. 8 which illustrates the current limit circuit in connection with components of the previously described precipitator system, with identical reference numberals being used to described common components. It should, however, be understood that the current limit circuit may be utilized in applications other than the precipitator system. Modifications may be made in the components which are common with the above described precipitator system.

Alernating curent input is applied to terminals 7 and 8. Terminal 87 is connected through contact 9 and line 11 to one side of a load. Terminal 8 is connected through another contact 10, line 12, and back-to-back connected silicon controlled rectifiers 13 and 14 to the other side of the load. As previously described, firing pulses applied by line 19' and 19'' are applied to the gates of the silicon contolled rectifiers in order to regulate their conduction angle and thus, to regulate the voltage and the current applied to the load. The current in line 12 is sensed by current transformer CT whose output 39 is applied to a root means square to DC converter 200. Such devices ar commercially available, e.g. Analog Devices Type 440. The output of device 200, a DC signal proportional to the root means square value of the sensed current is connected by line 201 to one end of current limit potentiometer 202 whose other end is connected to a common terminal. The arm 203 of potentiometer 202 is connected to squaring circuit 204. The setting of arm 203 of the primary current limit potentiometer establishes the portion of the sensed RMS current signal which is applied to the squaring circuit and thus establishes the value of the current limit, i.e. the 100 percent $I_p$ value. The output of squaring circuit 204 is current $I_o$ which is proportional to the square of the actual root means square current flowing in the power line, i.e. the protected line 12.

A typical power function circuit, useful to perform the squaring function, and thus useful as a squaring circuit 204, is illustrated in FIG. 4, page A30-3 of the National Semiconductor Linear Applications Manual, February 1973. If this circuit is utilized, the input to the squaring circuit 204, from potentiometer arm 203 is connected to the voltage input $E_1$ of the above referenced FIG. 4 circuit. That circuit (not illustrated herein) utilizes the logarithmic relationship between the emitter-base signal and the electrode current to generate an exponential function. By proper selection of the resistors in a voltage divider network, R9 and R10, the collector-emitter circuit of transistor Q4 provides an output current which is proportional to the square of the input signal. This outer current signal, $I_o$, of the squaring amplifier 204 is applied to input 205 of integrating amplifier A20.

A current $I_{ref}$ flowing through resistor 206 to input 205 has a predetermined magnitude and is opposite in direction to the $I_o$ current applied to input 205. The magnitude of resistor 206 is selected such that current $I_{ref}$ is equal and opposite to the output current $I_o$ of the squaring circuit when the current in the protected line 12 approaches the 100 percent $I_p$ level.

A capacitor 208 is connected between input 205 and output 207 of A20 so as to form an integrating amplifier. Output 207 is connected through diode 220 and line 221 to one input of flip-flop 222. The anode of diode 220 is connected to output 207 and the cathode is connected to line 221. Normally, output 207 is at a negative potential so that there is no current flow through diode 220. An output terminal of flip-flop 222 is connected by line 223 to coil 224, of undervoltage relay 225, whose other end terminal is connected to a terminal B. During normal operation, when there has been no current fow through diode 220, the flip-flop is in a state wherein current flows through line 223 and solenoid 224 to terminal B to maintain armature 226, of relay 225, in a position latched with protrusion 229 of circuit breaker member 228. Circuit breaker member 228 is connected to contacts 9 and 10. While the armature is latched to part 229, the contact 9 and 10 are maintained closed. As subsequently explained, a tripping command is manifested by current fow through diode 220 and line 221 so as to cause a change of state of flip-flop 222. This interrupts current flow through line 223 and solenoid 224. As a result, armature 226 is retracted by action of spring 227 so as to release detent 229 and to cause spring 231 to retract member 228 and to thus open contacts 9 and 10.

Output 207 of integrating amplifier A20 is additionally connected by resistor 210 to the non-inverting input 212 of operational amplifier A21. Resistor 211 is connected from a source of positive potential to input 212. Inverting input 213 of A21 is connected by resistor 230 to a common terminal and by feedback resistor 214 to output 215 of A21. In addition, the cathode of clamping diode 209 is connected to output 215 of A21 and its anode is connected to input terminal 205 of A20. Output 215 of A21 is connected through serially connected resistors 216, diode 219 and current limiter line 43 to the current reference and phase control circuitry 21-25. Lead capacitor 217 is connected across resistor 216 so as to be connected between output 215 of A21 and junction 218 between resistor 216 and the anode of diode 219. The current reference and phase control circuits 21

-25, which have been described in the preceeding text in connection with a precipitator system, have outputs 19' and 19" connected to the gates of silicon controlled rectifiers. The above reference circuit controls the firing angle of the SCR's so as to retard the firing angle of silicon controlled rectifiers 13 and 14 in response to a current limiting signal applied by line 43 to the current reference circuit. It should be noted that circuitry alternative to that disclosed for devices 13, 14 and 21 through 25 may be utilized to convert the current limit signal on line 43 to signals for limiting the current flow on line 12.

During normal operation of the power system when the current in line 12 is sufficiently below the predermined current limit, $I_o$, the current signal representative of the square of the RMS current in line 12, has a smaller magnitude than $I_{ref}$ the current in resistor 206. The summation of these two currents at input 205 causes integrating amplifier A20 to be clamped at a predetermined negative potential, e.g. minus 8 volts. Diode 220 is back-biased so that there can be no current flow on line 221 and no tripping of the circuit breaker. As explained subsequently, the output 215 of non-inverting amplifier A21 is clamped at a substantially different predetermined voltage, which is closer to zero but still is negative, e.g. 0.5 volts. Accordingly, diode 219 is also back-biased. This prevents current flow on line 43 and thus prevents current limiting regulatory action. In summary, when the load current is below the current limit such that $I_o$ is less than $I_{ref}$ the output potentials of A20 and of A21 are clamped to levels precluding application of a current limiting signal on line 43 and additionally precluding application of a tripping signal on line 221.

When the current in the protected power line 12 attains the predetermined current limit, the output of the squaring circuit 204, $I_o$, ncreases so as to exceed $I_{ref}$. The summation current of $I_o$ and $I_{ref}$ at input 205 of integrating amplifier A20 therefore reverses causing output 207 of integrating amplifier A20 therefore reverses causing output 207 of intergrating amplifier A20 to integrate positively toward zero volts. This rapidly drives the output of non-inverting amplifier A21 positive. Diode 219 is thus rapidly forward biased such that current flows through resistor 216, diode 219 and line 43 to the current reference and phase control circuits 21 -25. This results in the firing pulses on line 19' and 19" being modified so as to retard firing of the silicon controlled rectifiers 13 and 14 to maintain the current on line 12 within the predetermined current limit value. In summary, the output of amplifier A21 is normally clamped at a slightly negative potential, such that when $I_o$ exceeds $I_{ref}$ and A20 begins to integrate positively, current limiting action initiates almost instantly. The gain of the regulating circuit, including of amplifier A21, provides for substantial regulation of silicon controlled rectifiers 13 and 14 even when there is only a small voltage deviation at output 207 of itegrating amplifier A20. For example, when positive integration commences, so as to result in a small voltage change at output 207, for example, from a quiescent level of −8 volts Accordingly, the current limit regulation circuit comprising the current transformer, devices 200 and 204, A20, A21, diode 219, current reference and phase control circuit 21 - 25, and silicon controlled rectifiers 13 and 14 normally prevent the current on protected line 12 from exceeding the predetermined current limit while the output of integrating amplifer A20 is at a potential, (e.g. −7 volts) which is close to its quiescent level (e.g. −8 volts), but is substantially below the potential at which the circuit breaker is tripped (e.g. 0 volts). Thus, the potential difference between the clamped outputs of A20 and of A21 assures that the breaker is not tripped during normal operation of the system.

However, a malfunction, such as a shorted SCR, may prevent the above described regulating system from maintaining the current in protected line 12 within the current reference limit. In such an event, $I_o$ exceeds $I_{ref}$ and integrating amplifier A20 continues its integrating action. This causes output 207 to further decrease from its quiescent level to a sufficiently positive potential (e.g. 0 volts) to forward bias diode 220. The resulting current flows through diode 220 and line 221 causes flip-flop 222 to change its state. This cuts off the current through line 223 and solenoid 224, of undercurrent relay 225. Accordingly, armature 226 is pulled back by spring 227 releasing detent 229 and permitting member 228 to be pulled down so as to open contacts 9 and 10. In summary, if the current in protected line 12 commences to increase beyond the predetermined limit without current limit regulator being able to limit the line 12 current, $I_o$ exceeds $I_{ref}$ by an amount related to the square of the line current 12, and output 207 goes positive from the quiescent level at a rate determined by the magnitude of $I_o$. When output 207 goes positive to a predetermined level, e.g. 0 volts, diode 220 fires causing the circuit breaker to open. Thus, triggering occurs as a function of the magnitude of the sensed current and of the time during which an excessive current exists. Specifically, triggering occurs as a function of $I^2t$, the desired trip characteristic. The precise $I^2t$ characteristic is determined by the magnitude of capacitor 208 in the feedback circuit of integrating amplifier A20.

The following is a more detailed description of how the circuit comprising A20 and A21 accomplishes the above described functions. Output 207 is connected by resistor 210 to input 212 of non-inverting amplifier A21 and resistor 211 is connected from a source of positive potential to this input 212. This resistor network establishes the balance point, i.e. the quiescent voltage levels at outputs 207 and 125. For example, assume that resistor 211 has a magnitude of 15 K ohms and is connected to a source of + 15 volts, in respect to the common terminal. Accordingly, if input 212 is at 0 volts there is a 1 milliamp current through resistor 211. If one assumes that resistor 210 is 8 K ohms, the current through resistor 210 equals that through resistor 211 when the output 207 is −8 volts. Accordingly, when output 207 is at minus 8 volts, the potential drop across resistor 210 is 8 volts, that across resistor 214 is 15 volts and the input 213 of A21 is 0 volts. If the output 215 of A21 is at substantially 0 volts, the circuit is balanced.

During quiescent conditions, when $I_{ref}$ is greater than $I_o$, continued integration of integrator A20 tends to drive the output 207 below −8 volts. This tends to drive the input 212, as well as the output 215, of A21 more negative than 0 volts. However, when the output 215 drops below 0 by more than the diode drop across clamping diode 209, e.g. −0.5 volts, current flows from output 215 through diode 209 to the input 205 of A20. The non-inverting input of A20 (not illustrated) is conventionally connected to common, e.g. 0 volts, thus maintaining the integrator input 205 at 0 volts. Accordingly, current flow through diode 209 clamps the output 207 of A20 at a first predetermined magnitude, e.g.

−8 volts, and the output 215 of A21 at a second predetermined magnitude, e.g. −0.5 volts.

When $I_o$ exceeds $I_{ref}$, integrator A20 integrates such that its output 207 goes somewhat positive from the quiescent level. Because of the resulting change in current flow in the network comprising resistors 210 and 211, the non-inverting input 212, and output 215, of amplifier A21 rise above 0 volts. Resistors 214 and 230 connected to inverting input 213 cause the latter to attain the same voltage as on the non-inverting input 212. Thus, as the output 207 rises (e.g. from −8 volts to −7 volts), output 215 of A21 rises above its quiescent level (e.g. from −0.5 volts to 5 volts). A21 thus operates as a non-inverting amplifier. As the output 215 increases above 0 volts, diode 219 becomews forward-biased and regulating current flows on line 43 to provide the desired regulation action. Because of the integration action of A20, regulation tends to occur at the upper, i.e. long time, portion of the 100 percent $I_p$ line of FIG. 9. The $I_o$ current tends to equal $I_{ref}$ such that the potential at output 207 tends to remain constant after regulation has commenced.

If, because of some malfunction, the regulator fails to limit the current of line 12, output 207 commences to integrate positively to a predetermined trip potential, e.g. 0 volts, at which diode 220 is forward biased. The potential at output 207 at which the circuit breaker trips (e.g. zero volts) is substantially different from the potential at which regulation commences (e.g. near −8 volts) such that under conditions when there is no malfunction, full regulation of the power circuit current takes place without the breaker being tripped. The single clamped circuit assures a precise current limit point. The trip curve such as the hyperbolic $I^2t = k$ curve of FIG. 9 is maintained asymptotic to the 100 percent $I_p$ current limit line, the current limit maintained by the regulator. A single adjustment, e.g. the current limit potentiometer 202 simultaneously sets the trip and regulation characteristics. It should be noted that tripping arrangement other than devices 222, 225, 228 and 229 may be utilized.

While there is shown and described a particular embodiment of the invention, it will be obvious to those skilled in the art that various changes and modifications made without departing from the invention in its broader aspects and I therefore intend in the appended claims to cover all such changes and modifications that fall within the true spirit and scope of my invention.

What I claim as new and desire to secure by Letters Patent of the United States is:

1. A sawtooth waveform generator adapted to provide a train of sawtooth waveform signal having equal bi-polar excursions of predetermined amplitude and of frequency accurately related to the frequency of an AC input signal, comprising:
   a. first integrating means comprising an input, and an output adapted to supply said train of sawtooth waveform signal;
   b. a source of AC signal;
   c. pulse generating means responsive to said AC signal for producing unidirectional pulses having a predetermined frequency relationship with the frequency of said AC signal, and having a pulse duration which is short in respect to the time interval between pulses;
   d. first coupling means for coupling said unidirectional pulses to the input of said first integrating means for causing said first integrating means during application of each pulse to integrate in a first direction and to produce at its output rapid excursions of potential in a first polarity direction;
   e. voltage limiting means coupled to the output of said integrating means for limiting said excursions in a first polarity direction to a predetermined magnitude;
   f. a source of DC potential;
   g. second coupling means for coupling said source of DC potential to the input of said first integrating means for causing said first integrating means to integrate in a second direction commencing with the termination of each pulse and terminating with the initiation of a subsequent pulse, and to produce at its output gradual excursions of potential in a second polarity direction;
   h. second integrating means having a long RC time constant in respect to the frequency of said unidirectional pulses and comprising an input and and output;
   i. means for coupling the sawtooth waveformsignal produced by said first integrating means to the input of said second integrating means to produce at the output of said second integrating means an error signal constituting a time integral of amplitude differences between the bi-polar excursions of said sawtooth waveform; and
   j. means for coupling said error signal from the output of said second integrating means to the input of said first integrating means in a manner to reduce said amplitude differences so as to provide a sawtooth waveform signal having equal bi-polar excursions of predetermined amplitude.

2. The sawtooth waveform generator of claim 1 wherein said pulse generating means comprises a zero crossing detector producing output pulses responsive to zero crossings of the AC signal.

3. The sawtooth waveform generator of claim 2 wherein said voltage limiting means comprises a Zener diode and a unidirectional conducting diode means connecting in series circuit between the input and the output of said first integrating means.

4. The sawtooth waveform generator of claim 3 wherein said first integrating means comprises an operational amplifier with capacitance means coupled between its input and output and said second coupling means comprises resistance means connected between said source of DC potential and the input of said operational amplifier.

5. A sawtooth waveform generator adapted to provide a train of sawtooth waveform signal having equal bi-polar excursions of predetermined amplitude and being synchronized to twice the frequency of an AC signal, comprising:
   a. first integrating means comprising:
      1. first operational amplifying means with an input, and an output adapted to provide said sawtooth waveform signal;
      2. first capacitance means connected to said input and output;
      3. Zener reference means and diode means connected so as to be oppositely poled in series circuit across said input and output.
      4. first resistance means connected from said input to a source of potential of first polarity;
   b. a source of AC potential;
   c. a zero crossing detector having an input coupled said source and an output coupled to the input of said first operational amplifying means to provide to said input a train of pulses synchronous in frequency with the zero crossings of said AC potential, and of a potential opposite to said first polarity;

d. second integrating means, comprising:
  1. second operational amplifying means with an input and output;
  2. second capacitance means connected to said input and output;
  3. second resistance means coupled from the output of said first operational amplifying means to the input of said second operational amplifying means;
  4. second capacitance means and said second resistance means being selected such that said second integrating means has a very large time constant in respect to the frequency of said AC potential; and e. amplifying means comprising third operational amplifying means having an output coupled to the output of said second operational amplifying means, and its output coupled to the input of said first operational amplifying means.

* * * * *